United States Patent
Ikhtiar et al.

(10) Patent No.: US 11,009,570 B2
(45) Date of Patent: May 18, 2021

(54) HYBRID OXIDE/METAL CAP LAYER FOR BORON-FREE FREE LAYER

(71) Applicant: Samsung Electronics Co., Ltd., Suwon-si (KR)

(72) Inventors: Ikhtiar, San Jose, CA (US); Xueti Tang, Fremont, CA (US); Mohamad Krounbi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 16/194,248

(22) Filed: Nov. 16, 2018

(65) Prior Publication Data
US 2020/0158796 A1    May 21, 2020

(51) Int. Cl.
| | |
|---|---|
| *G01R 33/09* | (2006.01) |
| *H01F 10/32* | (2006.01) |
| *H01L 43/10* | (2006.01) |
| *H01L 43/12* | (2006.01) |
| *H01L 43/08* | (2006.01) |
| *H01F 41/30* | (2006.01) |

(52) U.S. Cl.
CPC ....... *G01R 33/098* (2013.01); *H01F 10/3286* (2013.01); *H01F 10/3295* (2013.01); *H01F 41/307* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 6,709,767 B2* | 3/2004 | Lin | ........................ | B82Y 10/00 148/277 |
| 7,087,324 B2* | 8/2006 | Hong | .................... | B82Y 10/00 360/324 |
| 7,190,557 B2* | 3/2007 | Li | ......................... | B82Y 10/00 360/320 |
| 7,241,514 B2* | 7/2007 | Kagami | ................. | B82Y 10/00 428/811.1 |
| 7,446,985 B2* | 11/2008 | Lee | ......................... | G11B 5/39 360/324.12 |
| 7,652,852 B2* | 1/2010 | Maehara | ................. | H01L 43/12 360/313 |

(Continued)

FOREIGN PATENT DOCUMENTS

| | | |
|---|---|---|
| EP | 2205029 A1 | 7/2010 |
| WO | WO 2018/004698 A1 | 1/2018 |

OTHER PUBLICATIONS

Guo et al. (Nanoscale Horiz., 2019, 4, 592) (Year: 2019).*

(Continued)

*Primary Examiner* — Kevin M Bernatz
(74) *Attorney, Agent, or Firm* — Lewis Roca Rothgerber Christie LLP (57) ABSTRACT

A magnetic tunnel junction stack includes: a pinned layer; a main oxide barrier layer on the pinned layer; a free layer on the main oxide barrier layer; and a hybrid oxide/metal cap layer on the free layer. The hybrid oxide/metal cap layer includes: a first oxide layer on the free layer; a second oxide layer on the first oxide layer; and a metallic cap layer on the second oxide layer, wherein the free layer is free of boron (B).

20 Claims, 4 Drawing Sheets

(56) References Cited

U.S. PATENT DOCUMENTS

| | | | |
|---|---|---|---|
| 8,147,994 B2* | 4/2012 | Matsuzawa | H01F 10/3272 |
| | | | 428/812 |
| 8,315,019 B1* | 11/2012 | Mao | G01R 33/098 |
| | | | 360/320 |
| 8,378,330 B2* | 2/2013 | Horng | B82Y 25/00 |
| | | | 257/2 |
| 8,852,760 B2 | 10/2014 | Wang et al. | |
| 9,082,534 B2 | 7/2015 | Chepulskyy et al. | |
| 9,425,387 B1 | 8/2016 | Liu et al. | |
| 9,577,181 B2 | 2/2017 | Tang et al. | |
| 9,905,753 B2 | 2/2018 | Lee et al. | |
| 9,923,138 B2 | 3/2018 | Park et al. | |
| 2001/0006444 A1* | 7/2001 | Hayakawa | G11B 5/3903 |
| | | | 360/324.1 |
| 2002/0024778 A1* | 2/2002 | Xue | B82Y 10/00 |
| | | | 360/324.1 |
| 2003/0030944 A1* | 2/2003 | Lin | G11B 5/3903 |
| | | | 360/324.1 |
| 2004/0157067 A1* | 8/2004 | Kusumi | G01R 33/02 |
| | | | 428/473.5 |
| 2006/0114615 A1* | 6/2006 | Pinarbasi | G11B 5/127 |
| | | | 360/322 |
| 2008/0176108 A1* | 7/2008 | Cheng | G11B 5/3106 |
| | | | 428/814 |
| 2009/0027810 A1* | 1/2009 | Horng | H01L 43/08 |
| | | | 360/324.2 |
| 2010/0072524 A1* | 3/2010 | Huai | B82Y 25/00 |
| | | | 257/295 |
| 2013/0238922 A1 | 9/2013 | Ling et al. | |
| 2015/0008547 A1 | 1/2015 | Pi et al. | |
| 2016/0358527 A1 | 12/2016 | Bae et al. | |
| 2017/0125481 A1 | 5/2017 | Kan et al. | |
| 2017/0140804 A1 | 5/2017 | Apalkov et al. | |
| 2017/0194556 A1 | 7/2017 | Brown et al. | |
| 2017/0338404 A1 | 11/2017 | Hu et al. | |

OTHER PUBLICATIONS

Patake et al. (App. Surf. Sci., 254(9):2820-2824) Abstract Only (Year: 2008).*

Thermodynamic Properties of Minerals and Related Substances at 298.15 K and 1 Bar ( 105 Pascals) Pressure and at Higher Temperatures, Robie et al. book, 1979, pp. 1-22 (Year: 1979).*

Band gap for zinc oxide webpage citation (1 page) (Year: NA) (Year: NA).*

Band gap for aluminum oxide webpage citation (1 page) (Year: NA).*

Band gap for tantalum oxide webpage citation (1 page) (Year: NA).*

G.H. Yu, et al., Inter-diffusion study in MgO tunneling magnetoresistive (TMR) system by XPS, Applied Surface Science, 2010, pp. 6592-6595, vol. 256, Elsevier B.V.

EPO Extended Search Report dated Dec. 10, 2019, for corresponding European Patent Application No. 19188467.5 (13 pages).

* cited by examiner

WITHOUT 1ST OXIDE
UNDERLAYER//MgO/B-FREE FREE LAYER(13Å)/
MgO/METAL-CAP///400C, 30MIN.

$M_s t = 183.7 \mu emu/cm^2, \alpha = 0.0067,$
$Hk = 7.37 kOe$

FIG. 4

WITH 1<sup>ST</sup>OXIDE UNDERLAYER//MgO/B-FREE FREE LAYER(13Å)/ 1<sup>ST</sup>OXIDE/MgO/METAL-CAP///400C, 30MIN.

$M_s t = 177.8 \mu emu/cm^2, \alpha = 0.0031,$
$Hk = 8.2 kOe$

HYBRID OXIDE/METAL CAP LAYER FOR BORON-FREE FREE LAYER

CROSS-REFERENCE TO RELATED APPLICATION(S)

This application is related to U.S. patent application Ser. No. 15/590,101, filed on Feb. 6, 2018, the entire content of which is incorporated herein by reference.

BACKGROUND

Field

The present disclosure relates to magnetic tunnel junction (MTJ), for example, perpendicular magnetic tunnel junction (p-MTJ).

Description of the Related Art

Conventional spin torque transfer (STT) magnetic random access memory (MRAM) stores a charge state, representative of a binary bit, by passing a charge current through a perpendicular magneto tunnel junction (p-MTJ), which has a tunnel barrier stacked between a free magnetic layer and a pinned (or fixed) magnetic layer. The charge current affects the magnetic moment of the free layer to either be aligned or anti-aligned with the magnetic moment of the pinned layer (which is unaffected by the current). As the alignment of magnetic moments remains unchanged in the absence of the charge current, the MTJ stack behaves as a bi-stable system suitable for memory storage.

There is a need for obtaining low switching current, sufficient thermal stability and long retention time concurrently or simultaneously in a p-MTJ.

The above information disclosed in this Background section is only for enhancement of understanding of the background of the invention, and therefore it may contain information that does not form the prior art that is already known to a person of ordinary skill in the art.

SUMMARY

An aspect of embodiments of the present invention is directed toward a magnetic tunnel junction (MTJ) stack including a boron-free free layer and having a low switching current without sacrificing long data retention time and good thermal stability.

Another aspect of embodiments of the present invention is directed toward a method of forming the magnetic tunnel junction (MTJ) stack.

According to some embodiments of the present disclosure, a magnetic tunnel junction stack includes: a pinned layer; a main oxide barrier layer on the pinned layer; a free layer on the main oxide barrier layer; and a hybrid oxide/metal cap layer on the free layer, wherein the hybrid oxide/metal cap layer includes: a first oxide layer on the free layer; a second oxide layer on the first oxide layer; and a metallic cap layer on the second oxide layer, wherein the free layer is free of boron (B).

The free layer may include $Co_xFe_{1-x}(0<x<1)$, CoFeNi, $Co_2FeAl$, $Co_2MnSi$, $Co_2FeMnSi$, $Co_2FeSi$, MnGa, and/or MnGe.

The first oxide layer may include a first oxide, and the second oxide layer may include a second oxide, the second oxide having a band gap equal to or greater than a band gap of the first oxide.

The first oxide layer may include one or more oxides selected from $AlO_x$, $ZnO_x$, $TiO_x$, $VO_x$, $GaO_x$, $YO_x$, $ZrO_x$, $NbO_x$, $HfO_x$, $TaO_x$, $SiO_x$, $MgGaO_x$, Hf—Zr—$O_x$, Hf—Si—$O_x$, Zr—Si—$O_x$, Hf—Al—$O_x$, Zr—Al—$O_x$, and In—Ga—Zn—O.

The second oxide layer may include one or more oxides selected from MgO, MgAlO, MgTiO, and $AlO_x$.

The metallic cap layer may include a metal element having a higher Gibbs free energy of oxide formation than a metal element in the first oxide layer and a metal element in the second oxide layer.

The metallic cap layer may include one or more metals selected from Ru, W, Mo, Co, Fe, Ni, CoFe, FeNi, CoNi, CoFeB, CoFeBMo, and CoFeBW.

The hybrid oxide/metal cap layer may be free of boron (B).

The first oxide layer may be an amorphous layer or a semi-crystalline layer.

The damping factor ($\alpha$) of the free layer may be about 0.006 or lower.

The damping factor ($\alpha$) of the free layer may be about 0.004 or lower.

The free layer may have a $M_st$ of greater than about 80 $\mu emu/cm^2$, and an $H_k$ of greater than about +1 kOe, thereby providing a free layer suitable for being perpendicularly magnetized.

According to some embodiments of the present disclosure, a method of manufacturing a magnetic tunnel junction stack includes: forming a pinned layer on a substrate; forming a main oxide barrier layer on the pinned layer; forming a free layer on the main oxide barrier layer; and forming a hybrid oxide/metal cap layer on the free layer, wherein the forming of the hybrid oxide/metal cap layer includes: forming a first oxide layer on the free layer; forming a second oxide layer on the first oxide layer; and forming a metallic layer on the second oxide layer, and wherein the free layer is free of boron (B).

The forming of the first oxide layer or the forming of the second oxide layer may be by direct sputtering of an oxide target.

The forming of the first oxide layer or the forming of the second oxide layer may include: depositing a metallic layer, and oxidizing the metallic layer to provide the first or second oxide layer.

The first oxide layer may include a first oxide, and the second oxide layer may include a second oxide, the second oxide having a band gap equal to or greater than a band gap of the first oxide.

The first oxide layer may include one or more oxides selected from $AlO_x$, $ZnO_x$, $TiO_x$, $VO_x$, $GaO_x$, $YO_x$, $ZrO_x$, $NbO_x$, $HfO_x$, $TaO_x$, $SiO_x$, $MgGaO_x$, Hf—Zr—$O_x$, Hf—Si—$O_x$, Zr—Si—$O_x$, Hf—Al—$O_x$, Zr—Al—$O_x$, and In—Ga—Zn—O.

The second oxide layer may include one or more oxides selected from MgO, MgAlO, MgTiO, and $AlO_x$.

The metallic cap layer may include one or more metals selected from Ru, W, Mo, Co, Fe, Ni, CoFe, FeNi, CoNi, CoFeB, CoFeBMo, and CoFeBW.

The first oxide layer may have a thickness of about 1 to 6 Å.

The damping factor ($\alpha$) of the free layer may be about 0.006 or lower.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as applicable to other similar features or aspects in other exemplary embodiments. Like reference numerals designate like elements throughout the specification.

Figure 1:
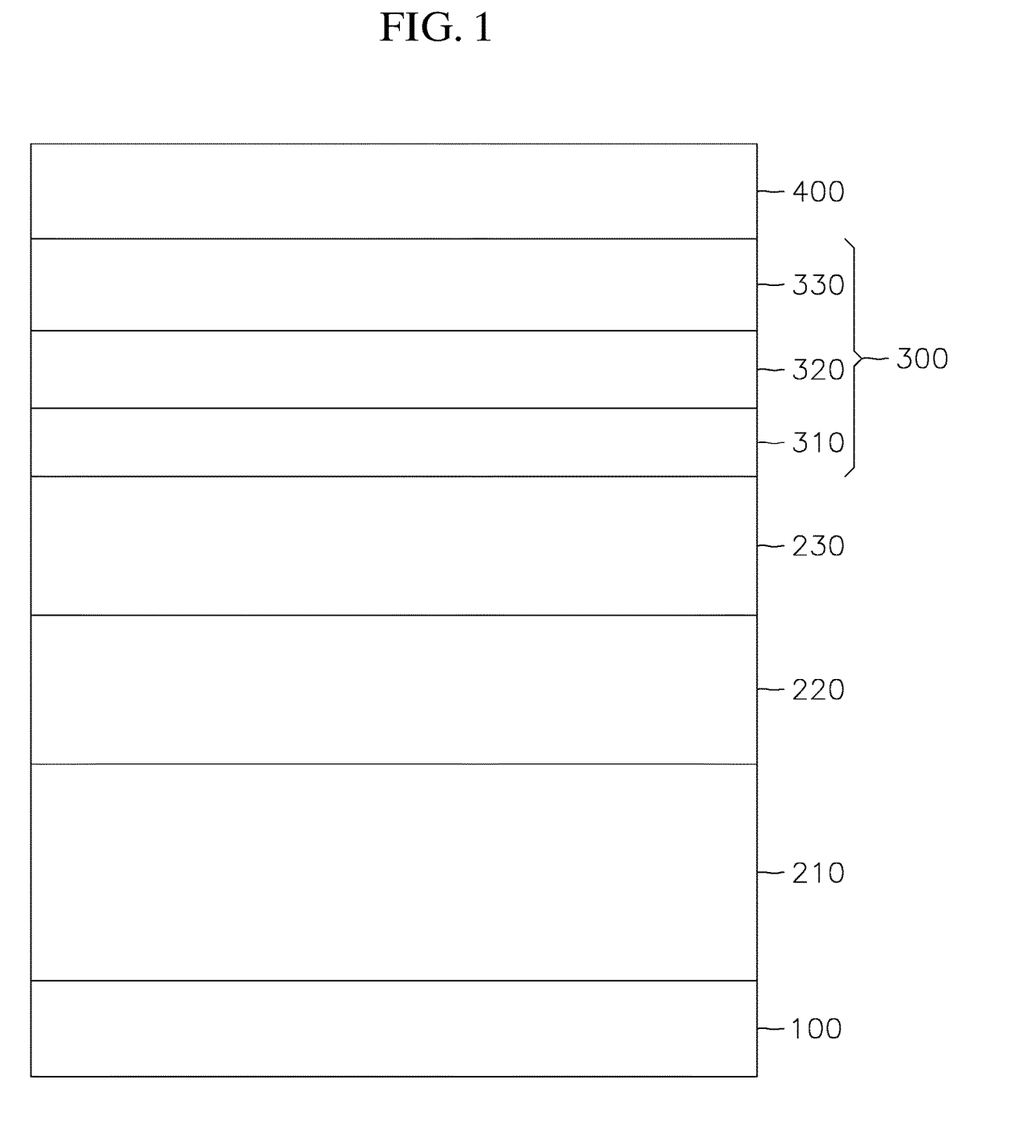
FIG. 1 is a cross-sectional schematic representation of a p-MTJ stack according to some example embodiments of the present invention.

FIG. 1 is a cross-sectional schematic representation of a perpendicular magnetic tunnel junction (p-MTJ) stack according to some example embodiments of the present invention.

Referring to FIG. 1, the p-MTJ stack includes an underlayer 100, a pinned layer 210 (e.g., a fixed layer or a reference layer) on the underlayer 100, a main oxide barrier layer 220 (also referred to as a nonmagnetic tunneling barrier layer or a non-magnetic layer) on the pinned layer 210, a free layer 230 on the main oxide barrier layer 220, and a hybrid oxide/metal cap layer 300 on the free layer 230.

The underlayer 100 is the substrate for deposition of the MTJ stack. It provides the surface on which the pinned layer 210 is formed. Any suitable materials and structures may be utilized as the underlayer 100.

The pinned layer 210 includes magnetic material that exhibits a fixed axis (e.g., a pinned or permanent axis) of magnetization perpendicular to the interface between the underlayer 100 and pinned layer 210. The pinned layer may include suitable magnetic materials and non-magnetic materials, such as cobalt (Co), iron (Fe), cobalt iron alloy (CoFe), a cobalt iron boron alloy (e.g., CoFeB), tantalum (Ta), Tungsten (W), Molybdenum (Mo), platinum (Pt), ruthenium (Ru), Iridium (Ir), and/or the like. The main oxide barrier layer 220 may include a non-magnetic material such as crystalline magnesium oxide (MgO), amorphous aluminum oxide, and/or the like. The free layer 230 may include a magnetic material and may be free of boron.

In a conventional perpendicular magnetic tunnel junction (p-MTJ), the free layer typically contains boron (B). The boron containing free layer is easier to handle and process. However, the boron containing free layer tends to have lower data retention time. Further, to attain adequate (e.g., high) perpendicular magnetic anisotropy (PMA), two oxide layers are utilized to sandwich the boron containing free layer. In addition, to obtain adequate (e.g., high) tunneling magnetoresistance (TMR), boron absorbing layers are deposited on the free layer or in the middle of free layer. An annealing process may be utilized to allow boron to diffuse from the free layer to adjacent layers, and further diffuse away from the interface between the free layer and its adjacent layers.

While the amount of boron in the free layer may be reduced through the above described structure and process in a conventional p-MTJ, there may be residue boron in the free layer. In addition, boron still exists in the absorbing layers and/or oxide layers adjacent to the free layer, and may lead to deteriorated retention time.

In the p-MTJ stack according to embodiments of the present disclosure, the free layer 230 does not contain boron and is a boron-free free layer. The material(s) deposited for the boron-free free layer 230 may include 3d transition metals, their alloys and/or Heusler alloys such as $Co_xFe_{1-x}$ ($0 \leq x \leq 1$), CoFeNi, $Co_2FeAl$, $Co_2MnSi$, $Co_2FeMnSi$, $Co_2FeSi$, MnGa, and/or MnGe. Thus, binary, ternary and other alloys not including boron may be deposited on the main oxide barrier layer 220 to form the boron-free free layer 230. Stated differently, other and/or additional non-magnetic and/or magnetic materials excluding boron may be provided for the boron-free free layer. For example, at least one of elemental Fe, elemental Co, elemental Ni, elemental Mn, an Fe-containing alloy such as CoFe, a Co-containing alloy such as CoFe, a Ni-containing alloy, a Mn containing alloy and a Heusler alloy, excluding boron, may be utilized for forming the boron-free free layer 230. The boron-free free layer 230 may include the materials described above and may be polycrystalline, amorphous, or crystalline-amorphous composite as deposited. In addition, the boron-free free layer 230 may have a high PMA. The perpendicular magnetic anisotropy energy of the free layer 230 may exceed the out-of-plane demagnetization energy. Thus, the magnetic moment of the boron-free free layer 230 may be stable perpendicular-to-plane.

Additional examples of the boron-free free layer and the method of making the same can be found in related U.S. patent application Ser. No. 15/590,101, the disclosure of which is incorporated herein by reference in its entirety.

The boron-free free layer 230 may have a crystalline structure after a post annealing process. Because no boron is included in the formation of the free layer 230 according to embodiments of the present disclosure, no boron-absorbing layer is needed and the post-annealing process to drive boron to layers adjacent to the free layer is not needed. Further, without boron, the p-MTJ stack has higher degree of freedom in that the delicate control of boron-diffusion is not an issue (e.g., a main issue) in the manufacturing process anymore for getting high TMR and high perpendicular magnetic anisotropy (PMA).

Some of the desirable properties for a p-MTJ include low switching current, sufficient thermal stability and/or long retention time for improved write efficiency and data retention. These properties are affected by the saturation magnetization, damping constant, anisotropy field, and other properties of the free layer. For example, sufficient saturation magnetization and high anisotropy field are required for the long retention time and thermal stability of the device.

The boron-free free layer 230 has a high perpendicular magnetic anisotropy, thereby providing sufficient data retention time in the p-MTJ stack. For example, the boron-free free layer 230 may have a $M_s t$ greater than about 80 $\mu emu/cm^2$, for example, greater than 120 $\mu emu/cm^2$, or greater than 180 $\mu emu/cm^2$; and a $H_k$ greater than +1 kOe, for example, greater than +4 kOe. When the Mst and $H_k$ values are within the above ranges, the free layer may be (e.g., readily or suitably) perpendicularly magnetized, e.g., with the preferred magnetization orientations perpendicular to the physical plane of the free layer.

The hybrid oxide/metal cap layer 300 according to embodiments of the present disclosure includes a first oxide layer 310 on the free layer 230; a second oxide layer 320 on the first oxide layer 310; and a metallic cap layer 330 on the second oxide layer 320.

The first oxide layer 310 is in contact with the boron-free free layer 230, and the second oxide layer 320 is in contact with the first oxide layer 310. The first oxide layer 310 may be made of an oxide with similar or lower band gap than that of the second oxide layer 320, thereby reducing or minimizing the parasitic resistance from the hybrid oxide/metal cap layer 300.

Non-limiting examples of the oxide for forming the first oxide layer 310 include aluminum oxide ($AlO_x$) zinc oxide ($ZnO_x$), titanium oxide ($TiO_x$), vanadium oxide ($VO_x$), gallium oxide ($GaO_x$), yttrium oxide ($YO_x$), zirconium oxide ($ZrO_x$), niobium oxide ($NbO_x$), hafnium oxide ($HfO_x$), tantalum oxide ($TaO_x$), silicon oxide ($SiO_x$), magnesium gallium oxide ($MgGaO_x$), hafnium zirconium oxide (Hf—Zr—$O_x$), hafnium silicon oxide (Hf—Si—$O_x$), zirconium silicon oxide (Zr—Si—$O_x$), hafnium aluminum oxide (Hf—Al—$O_x$), zirconium aluminum oxide (Zr—Al—$O_x$), and indium gallium zin oxide (In—Ga—Zn—O). However, the present disclosure is not limited thereto and any suitable metal oxide may be utilized to form the first oxide layer.

In the p-MTJ stack according to embodiments of the present disclosure, boron is not utilized in forming the free layer. Therefore, there is no boron in the vicinity of the interface between the boron-free free layer 230 and the first oxide layer 310.

The second oxide layer 320 may include a metal that is easier to form an oxide than the first oxide layer 310 and the metallic cap layer 330. That is, the second oxide layer 320 may include a metal with the lowest Gibbs free energy of oxide formation (i.e., easiest to form the oxide) compared with that of the first oxide layer 310 and the metallic cap layer 330. Non-limiting examples of the oxide for forming the second oxide layer 320 include magnesium oxide (MgO), magnesium aluminum oxide (MgAlO), magnesium titanium oxide (MgTiO), and aluminum oxide ($AlO_x$). However, the present disclosure is not limited thereto and any suitable metal oxide may be utilized to form the second oxide layer 320.

The first oxide layer 310 may be an amorphous layer or a semi-crystalline layer (or a layer with an amorphous and crystalline composite structure). That is, the first oxide layer 310 may not have ordered arrangement of constituting atoms and/or molecules, or may have regions of ordered arrangement of constituting atoms and/or molecules mixed with regions of no such ordered arrangements. On the other hand, the boron-free free layer 230 may be a crystalline layer (e.g., with a crystalline structure) or crystalline-amorphous composite layer. Typically, when the crystalline oxide (utilized as the second oxide layer 320, such as MgO, $MgAlO_x$, $MgTiO_x$, etc.) is directly deposited on the crystalline boron-free free layer, the corresponding oxide layer may be crystalline. Accordingly, there may be a mismatch in the lattice structure between the boron-free free layer 230 and the second oxide layer 320. When the first oxide layer 310 according to embodiments of the present disclosure, having an amorphous or semi-crystalline structure, is inserted between the boron-free free layer 230 and the second oxide layer 320, the mismatch in the lattice structure may be relaxed or reduced, thereby reducing the tension at the interface between these layers. The insertion of the first oxide layer 310 (e.g., depositing the second oxide layer 320 directly on the first oxide layer 310) may also make the second oxide layer 320 to be an amorphous layer or a semi-crystalline layer. As such, the second oxide layer 320 may also be an amorphous layer or a semi-crystalline layer (or a layer with an amorphous and crystalline composite structure).

The first oxide layer 310 may have a thickness of about 1 to 6 Å. For example, the first oxide layer 310 may have a thickness of about 1 to 3 Å. When the thickness of the first oxide layer 310 is within the above ranges, an amorphous layer or a semi-crystalline layer may be formed. The second oxide layer 320 may have a thickness of about 1 to 8 Å. For example, the second oxide layer 320 may have a thickness of about 3 to 8 Å. A total thickness of the first oxide layer 310 and the second oxide layer 320 may be about 4 to 14 Å.

The metallic cap layer 330 may be made of metal element(s) with higher Gibbs free energy of oxide formation (i.e., more difficult to form an oxide) than the metal element(s) utilized in the first and second oxide layers 310 and 320. Accordingly, the metallic cap layer 330 would not easily form corresponding oxides upon high temperature annealing, thereby preventing or suppressing oxygen diffusion out of the first and second oxide layers 310 and 320. Non-limiting examples of metals for forming the metallic cap layer 330 include ruthenium (Ru), tungsten (W), molybdenum (Mo), cobalt (Co), iron (Fe), nickel (Ni), cobalt iron (CoFe), iron nickel (FeNi), cobalt nickel (CoNi), cobalt iron boron (CoFeB), cobalt iron boron molybdenum (CoFeBMo), and cobalt iron boron tungsten (CoFeBW). However, the present disclosure is not limited thereto and any suitable metal may be utilized to form the metallic cap layer 330.

The hybrid oxide/metal cap layer 300 may have a lower electrical resistance than the main oxide barrier layer 220. The total thickness of the first and second oxide layers 310 and 320 may be lower than the thickness of the main oxide barrier layer 220.

A p-TMJ may need all of low switching current, sufficient thermal stability and long retention time for improved write efficiency and data retention. The boron-free free layer 230 according to embodiments of the present disclosure has a high perpendicular magnetic anisotropy, thereby providing sufficient data retention time and thermal stability. The switching current Jc (i.e., the lowest current required to switch the magnetic moment of the free layer) can be represented by Equation 1 below:

$$Jc = \frac{2e\mu_0 t M_S}{\eta \hbar}(\alpha)(H_k) \qquad \text{Equation 1}$$

In Equation 1, e represents the electron charge, $\mu_0$ represents the vacuum permeability, t represents the free layer thickness, $M_s$ represents the saturation magnetization, $\eta$ represents the spin transfer efficiency, $\hbar$ represents the Planck constant, $\alpha$ represents the damping constant and $H_k$ represents the anisotropy field, respectively. As sufficient areal magnetization (the product of thickness t and saturation magnetization $M_s$) $M_s t$ and high anisotropy field $H_k$ are desirable for the long retention time and thermal stability of the device, the damping constant $\alpha$ is reduced in order to attain low switching current and improve efficiency in power consumption according to embodiments of the present disclosure.

In the p-TMJ stack according to embodiments of the present disclosure, the damping constant of the boron-free free layer 230 is modified through the hybrid oxide/metal cap layer 300. The damping constant according to embodiments of the present disclosure may be 0.006 or lower. For example, the damping constant may be 0.005 or lower, or 0.004 or lower. With the reduced damping constant, the p-TMJ stack according to embodiments of the present disclosure simultaneously or concurrently has low switching current, high retention time, and good thermal stability.

Figure 2:
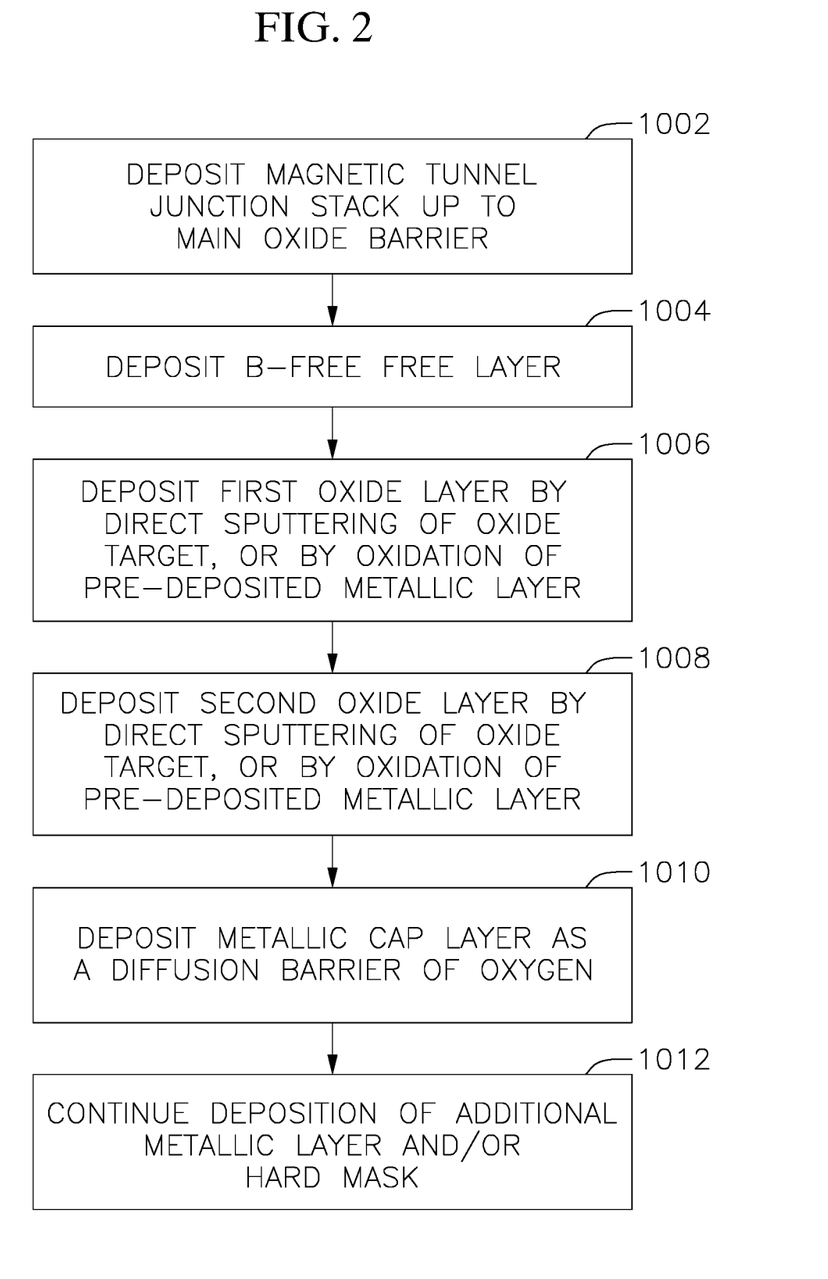
FIG. 2 is a flow diagram illustrating a process for manufacturing a p-MTJ stack according to some embodiments of the present invention.

FIG. 2 is a flow diagram illustrating a process for manufacturing a p-MTJ stack according to some embodiments of the present invention.

Referring to FIG. 2, in act 1002, the pinned layer and the main oxide barrier layer 220 of the perpendicular magnetic tunnel junction stack and other suitable layers below the pinned layer 210 are formed. The pinned layer 210 may be deposited on an underlayer 100 utilizing a suitable deposition technique. Non-limiting examples of the deposition techniques include chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. The pinned layer may be formed from a suitable magnetic materials and non-magnetic materials, such as cobalt (Co), iron (Fe), cobalt iron alloy (CoFe), a cobalt iron boron alloy (e.g., CoFeB), tantalum (Ta), Tungsten (W), Molybdenum (Mo), platinum (Pt), ruthenium (Ru), Iridium (Ir), and/or the like.

The main oxide barrier layer 220 may be formed on the pinned layer 210 utilizing a suitable deposition technique. Non-limiting examples of the deposition techniques include CVD, PECVD, RFCVD, PVD, ALD, MBD, PLD, and/or LSMCD, sputtering, and/or plating. The main oxide barrier layer 220 may include a non-magnetic material such as crystalline magnesium oxide (MgO), amorphous aluminum oxide, and/or the like.

In act 1004, the boron-free free layer 230 is deposited. Related U.S. patent application Ser. No. 15/590,101 discloses examples of suitable methods for forming the boron-free free layer, the disclosure of which is incorporated herein in its entity. The boron-free free layer 230 may include 3d transition metals, their alloys and/or Heusler alloys such as $Co_xFe_{1-x}(0 \leq x \leq 1)$, CoFeNi, $Co_2FeAl$, $Co_2MnSi$, $Co_2FeMnSi$, $Co_2FeSi$, MnGa, and MnGe.

In act 1006, the first oxide layer 310 is deposited. The first oxide layer 310 may be deposited by direct sputtering of an oxide target, or by oxidation of a metallic layer. For example, the first oxide layer 310 may be formed by first depositing a metallic layer on the boron-free free layer, and then oxidizing the metallic layer. The metallic layer may be deposited on the free layer 230 utilizing a suitable deposition technique. Non-limiting examples of the techniques include CVD, PECVD, RFCVD, PVD, ALD, MBD, PLD, and/or LSMCD, sputtering, and/or plating. The metallic layer may then be oxidized utilizing, for example, an oxidation process, whereby oxygen is flowed over the metallic layer at a suitable temperature which can range from, for example, about 178 K to about 478 K to oxidize the thin metallic layer into a metal oxide layer. The first oxide layer 310 may be made of an oxide with similar or lower band gap than that of the second oxide layer 320, thereby reducing or minimizing the parasitic resistance from the hybrid oxide/metal cap layer 300.

The first oxide layer 310 may include, for example, aluminum oxide ($AlO_x$) zinc oxide ($ZnO_x$), titanium oxide ($TiO_x$), vanadium oxide ($VO_x$), gallium oxide ($GaO_x$), yttrium oxide ($YO_x$), zirconium oxide ($ZrO_x$), niobium oxide ($NbO_x$), hafnium oxide ($HfO_x$), tantalum oxide ($TaO_x$), silicon oxide ($SiO_x$), magnesium gallium oxide ($MgGaO_x$), hafnium zirconium oxide (Hf—Zr—$O_x$), hafnium silicon oxide (Hf—Si—$O_x$), zirconium silicon oxide (Zr—Si—$O_x$), hafnium aluminum oxide (Hf—Al—$O_x$), zirconium aluminum oxide (Zr—Al—$O_x$), and indium gallium zin oxide (In—Ga—Zn—O). However, the present disclosure is not limited thereto and any suitable metal oxide may be utilized to form the first oxide layer 310.

In act 1008, the second oxide layer 320 is deposited. The second oxide layer 320 may be deposited by direct sputtering of an oxide target, or by oxidation of a metallic layer. For example, the second oxide layer 320 may be formed by first depositing a metallic layer on the boron-free free layer, and then oxidizing the metallic layer. The metallic layer may be deposited on the free layer 140 utilizing a suitable deposition technique. Non-limiting examples of the techniques include CVD, PECVD, RFCVD, PVD, ALD, MBD, PLD, and/or LSMCD, sputtering, and/or plating. The metallic layer may then be oxidized utilizing, for example, an oxidation process, whereby oxygen is flowed over the metallic layer at a temperature which can range from, for example, about 178 K to about 478 K to oxidize the thin metallic layer into a metal oxide layer. The second oxide layer 320 may include a metal that is easier to form an oxide than the first oxide layer 310 and the metallic cap layer 330. That is, the second oxide layer 320 may include a metal with the lowest Gibbs free energy of oxide formation (i.e., easiest to form the oxide) compared with that of the first oxide layer 310 and the metallic cap layer 330. Non-limiting examples of the oxide for forming the second oxide layer 320 include magnesium oxide (MgO), magnesium aluminum oxide (MgAlO), magnesium titanium oxide (MgTiO), and aluminum oxide ($AlO_x$). However, the present disclosure is not limited thereto and any suitable metal oxide may be utilized to form the second oxide layer 320.

The first oxide layer 310 may be an amorphous layer or a semi-crystalline layer (or a layer with an amorphous and crystalline composite structure). The boron-free free layer 230 may be a crystalline layer or crystalline-amorphous composite layer. Typically, when the crystalline oxide (utilized as the second oxide layer 320, such as MgO, $MgAlO_x$, $MgTiO_x$, etc.,) is directly deposited on the crystalline boron-free free layer, the corresponding oxide layer may be crystalline. Accordingly, there may be a mismatch in the lattice structure between the boron-free free layer 230 and the second oxide layer 320. When the first oxide layer 310 according to embodiments of the present disclosure, having an amorphous or semi-crystalline structure, is inserted between the boron-free free layer 230 and the second oxide layer 320, the mismatch in the lattice structure may be relaxed or reduced, thereby reducing the tension at the interface between these layers. The insertion of the first oxide layer 310 (e.g., depositing the second oxide layer 320 directly on the first oxide layer 310) may also make the second oxide layer 320 to be an amorphous layer or a semi-crystalline layer. As such, the second oxide layer 320 may also be an amorphous layer or a semi-crystalline layer (or a layer with an amorphous and crystalline composite structure).

The first oxide layer 310 may have a thickness of about 1 to 6 Å. For example, the first oxide layer 310 may have a thickness of about 1 to 3 Å. When the thickness of the first oxide layer 310 is within the above ranges, an amorphous layer or a semi-crystalline layer may be formed. The second oxide layer 320 may have a thickness of about 1 to 8 Å. For example, the second oxide layer 320 may have a thickness of about 3 to 8 Å. A total thickness of the first oxide layer 310 and the second oxide layer 320 may be about 4 to 14 Å.

In act 1010, the metallic cap layer 330 is deposited. The metallic cap layer 330 may be made of metal element(s) with higher Gibbs free energy of oxide formation (i.e., more difficult to form an oxide) than the metal element utilized in the first and second oxide layers 310 and 320. Accordingly, the metallic cap layer 330 would not easily form corresponding oxides upon high temperature annealing, thereby preventing or suppressing oxygen diffusion out of the first and second oxide layers 310 and 320. Non-limiting examples of metals for forming the metallic cap layer 330 include ruthenium (Ru), tungsten (W), molybdenum (Mo), cobalt (Co), iron (Fe), nickel (Ni), cobalt iron (CoFe), iron nickel (FeNi), cobalt nickel (CoNi), cobalt iron boron (CoFeB), cobalt iron boron molybdenum (CoFeBMo), and cobalt iron boron tungsten (CoFeBW). However, the present disclosure is not limited thereto and any suitable metal may be utilized to form the metallic cap layer 330.

In act 1012, additional metallic layer and/or a hard mask may be deposited on the metallic cap layer 330. The additional metallic layer and/or a hard mask may be deposited utilizing any suitable technique and may be formed from any suitable materials.

The MTJ stack may be further post-annealed at a suitable temperature, for example, 400° C. The first and second oxide layers 310 and 320 may inter-diffuse at the interface. Due to the absence of boron in the free layer, the MTJ stack is thermally stable, has high perpendicular anisotropy and low (e.g., ultra-low) damping constant. Further, the hybrid oxide/metal cap layer is free of boron (B). That is, the boron-free free layer 230, the first and second oxide layers 310 and 320, and the interface between these layers are all free of boron.

The damping constant according to embodiments of the present disclosure may be 0.006 or lower. For example, the damping constant may be 0.005 or lower, or 0.004 or lower.

Figure 3:
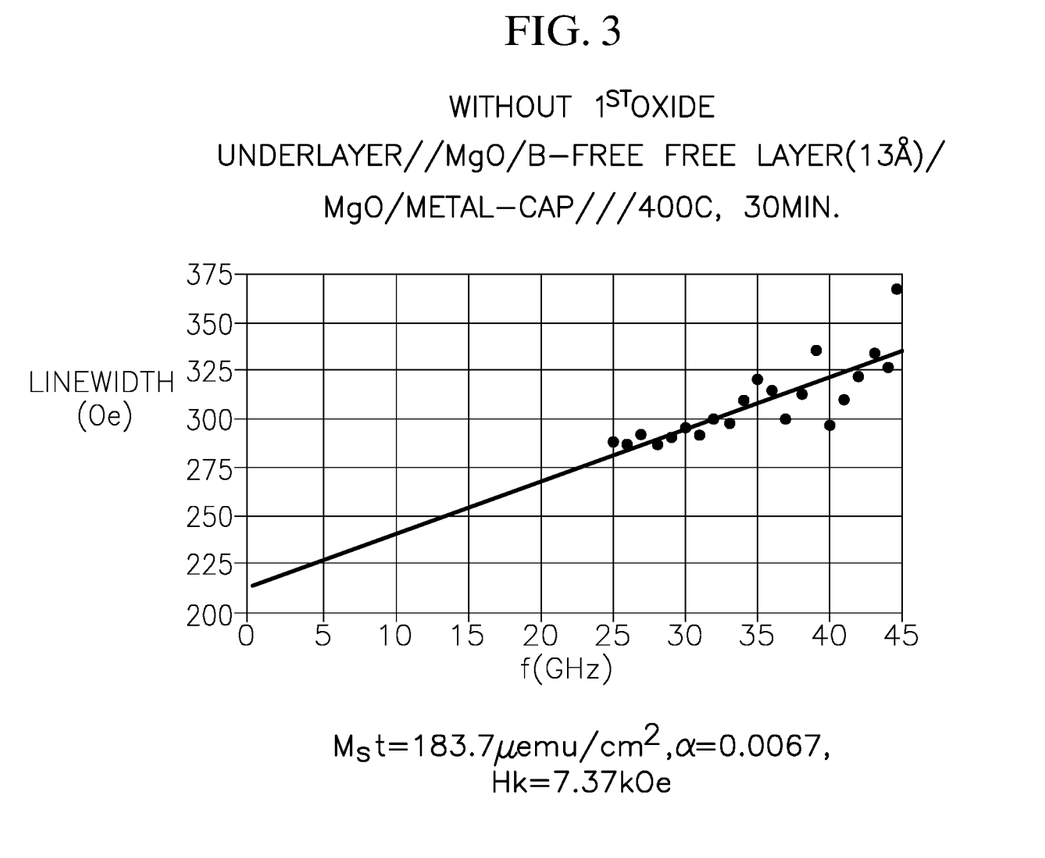
FIG. 3 illustrates the linewidth as a function of frequency extracted from broadband ferromagnetic resonance (FMR) measurement of a reference p-MTJ stack.

FIG. 3 illustrates the linewidth as a function of frequency extracted from broadband ferromagnetic resonance (FMR) measurement of a reference free-layer stack. The reference free-layer stack has the structure of underlayer/MgO/boron-free free layer (13 Å)/MgO/metallic cap layer, stacked in the stated order and annealed at 400° C. for 30 min. In this reference free-layer stack, no first oxide layer is included. From the data in FIG. 3 and a separate measurement utilizing a vibrating-sample magnetometer, it is calculated that the free-layer of FIG. 3 has the following parameters: Mst=183.7 µemu/cm$^2$, α=0.0067 and H k=7.37 kOe.

Figure 4:
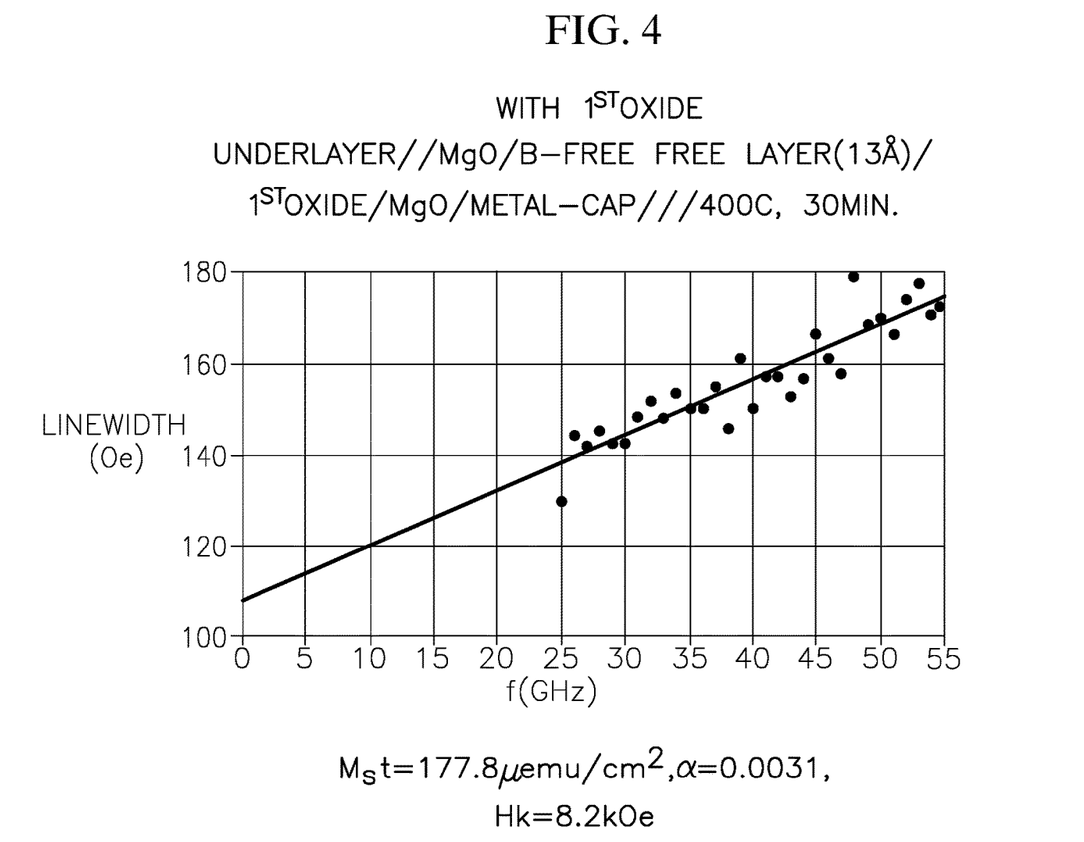
FIG. 4 illustrates the linewidth as a function of frequency extracted from broadband ferromagnetic resonance (FMR) measurement of a p-MTJ stack according to embodiments of the present disclosure.

FIG. 4 illustrates the linewidth as a function of frequency extracted from broadband ferromagnetic resonance (FMR) measurement of a free-layer stack according to embodiments of the present disclosure. The free-layer stack has the structure of underlayer/MgO/boron-free free layer (13 Å)/first oxide layer/MgO/metallic cap layer, stacked in the stated order and annealed at 400° C. for 30 min. Here, the free-layer stack of FIG. 4 utilizes the same underlayer, pinned layer, boron-free free layer, MgO between the pinned layer and the boron-free free layer, and the metallic cap layer as the free-layer stack of FIG. 3, with the exception of including the first oxide layer. From the data in FIG. 4 and a separate measurement utilizing a vibrating-sample magnetometer, it is calculated that the free-layer (or the free-layer stack) of FIG. 4 has the following parameters: $M_s$t=177.8 µemu/cm$^2$, α=0.0031, and Hk=8.2 kOe.

Comparing the free-layer stack of FIG. 4 with that of FIG. 3, it is shown that the free-layer stack according to embodiments of the present disclosure (e.g., including a first metal oxide layer and a second metal oxide layer) has a significantly lower damping constant α, while maintaining a sufficiently high $M_s$t and high Hk. As such, the free-layer stack according to embodiments of the present disclosure simultaneously has long retention time, good thermal stability and low critical current density.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

As used herein, "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

While a p-MTJ has been illustrated, embodiments of the present disclosure are not limited thereto. Other magnetic tunnel junctions with a boron-free free layer may utilize the hybrid oxide/metal cap layer.

The p-MTJ and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the p-MTJ may be formed on one integrated circuit (IC) chip or on separate IC chips. Further, the various components of the p-MTJ may be implemented on a flexible printed circuit film, a tape carrier package (TCP), a printed circuit board (PCB), or formed on a same substrate. Further, the various components of the p-MTJ may be a process or thread, running on one or more processors, in one or more computing devices, executing computer program instructions and interacting with other system components for performing the various functionalities described herein.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A magnetic tunnel junction stack comprising:
   a pinned layer;
   a main oxide barrier layer on the pinned layer;
   a free layer on the main oxide barrier layer; and
   a hybrid oxide/metal cap layer on the free layer,
   wherein the hybrid oxide/metal cap layer comprises:
      a first oxide layer on the free layer;
      a second oxide layer on the first oxide layer; and
      a metallic cap layer on the second oxide layer,
   wherein the free layer is free of boron (B), and
   wherein a thickness of the first oxide layer is about 1 to 6 Å and a total thickness of the first oxide layer and the second oxide layer is about 4 to 14 Å.

2. The magnetic tunnel junction stack of claim 1, wherein the first oxide layer comprises a first oxide, and
   the second oxide layer comprises a second oxide, the second oxide having a band gap equal to or greater than a band gap of the first oxide.

3. The magnetic tunnel junction stack of claim 1, wherein the first oxide layer comprises one or more oxides selected from $AlO_x$, $ZnO_x$, $TiO_x$, $VO_x$, $GaO_x$, $YO_x$, $ZrO_x$, $NbO_x$, $HfO_x$, $TaO_x$, $SiO_x$, $MgGaO_x$, Hf—Zr—$O_x$, Hf—Si—$O_x$, Zr—Si—$O_x$, Hf—Al—$O_x$, Zr—Al—$O_x$, and In—Ga—Zn—O.

4. The magnetic tunnel junction stack of claim 1, wherein the second oxide layer comprises one or more oxides selected from MgO, MgAlO, MgTiO, and $AlO_x$.

5. The magnetic tunnel junction stack of claim 1, wherein the metallic cap layer comprises a metal element having a higher Gibbs free energy of oxide formation than a metal element in the first oxide layer and a metal element in the second oxide layer.

6. The magnetic tunnel junction stack of claim 1, wherein the metallic cap layer comprises one or more metals selected from Ru, W, Mo, Co, Fe, Ni, CoFe, FeNi, CoNi, CoFeB, CoFeBMo, and CoFeBW.

7. The magnetic tunnel junction stack of claim 1, wherein the hybrid oxide/metal cap layer is free of boron (B).

8. The magnetic tunnel junction stack of claim 1, wherein the first oxide layer is an amorphous layer or a semi-crystalline layer.

9. The magnetic tunnel junction stack of claim 1, wherein the second oxide layer is an amorphous layer or a crystalline layer or a semi-crystalline layer.

10. The magnetic tunnel junction stack of claim 1, wherein the free layer comprises $Co_xFe_{1-x}$ wherein 0<x<1, CoFeNi, $Co_2FeAl$, $Co_2MnSi$, $Co_2FeMnSi$, $Co_2FeSi$, MnGa, and/or MnGe.

11. The magnetic tunnel junction stack of claim 1, wherein a damping factor ($\alpha$) of the free layer is about 0.006 or lower.

12. The magnetic tunnel junction stack of claim 1, wherein the free layer has a $M_s t$ of greater than about 80 $\mu emu/cm^2$, and an $H_K$ of greater than +1 kOe.

13. A method of manufacturing a magnetic tunnel junction stack, the method comprising:
   forming a main oxide barrier layer on a pinned layer;
   forming a free layer on the main oxide barrier layer; and
   forming a hybrid oxide/metal cap layer on the free layer,
   wherein the forming of the hybrid oxide/metal cap layer comprises:
      forming a first oxide layer on the free layer;
      forming a second oxide layer on the first oxide layer; and
      forming a metallic layer on the second oxide layer, and
   wherein the free layer is free of boron (B), and
   wherein a thickness of the first oxide layer is about 1 to 6 Å and a total thickness of the first oxide layer and the second oxide layer is about 4 to 14 Å.

14. The method of claim 13, wherein the forming of the first oxide layer or the forming of the second oxide layer is by direct sputtering of an oxide target.

15. The method of claim 13, wherein the forming of the first oxide layer or the forming of the second oxide layer comprises:
   depositing a metallic layer, and
   oxidizing the metallic layer to provide the first or second oxide layer.

16. The method of claim 13, wherein
   the first oxide layer comprises a first oxide, and
   the second oxide layer comprises a second oxide, the second oxide having a band gap equal to or greater than a band gap of the first oxide.

17. The method of claim 13, wherein the first oxide layer comprises one or more oxides selected from $AlO_x$, $ZnO_x$, $TiO_x$, $VO_x$, $GaO_x$, $YO_x$, $ZrO_x$, $NbO_x$, $HfO_x$, $TaO_x$, $SiO_x$, $MgGaO_x$, Hf—Zr—$O_x$, Hf—Si—$O_x$, Zr—Si—$O_x$, Hf—Al—$O_x$, Zr—Al—$O_x$, and In—Ga—Zn—O.

18. The method of claim 13, wherein the second oxide layer comprises one or more oxides selected from MgO, MgAlO, MgTiO, and $AlO_x$.

19. The method of claim 13, wherein the metallic layer comprises one or more metals selected from Ru, W, Mo, Co, Fe, Ni, CoFe, FeNi, CoNi, CoFeB, CoFeBMo, and CoFeBW.

20. The method of claim 13, wherein a damping factor ($\alpha$) of the free layer is about 0.006 or lower.

* * * * *